(12) United States Patent
Giebeler et al.

(10) Patent No.: US 9,601,649 B2
(45) Date of Patent: Mar. 21, 2017

(54) METHOD FOR PRODUCING A MICROSYSTEM HAVING A THIN FILM MADE OF LEAD ZIRCONATE TITANATE

(71) Applicant: Pyreos Ltd., Edinburgh (GB)

(72) Inventors: Carsten Giebeler, Edinburgh (GB); Matthias Schreiter, Munich (DE); Thorsten Steinkopff, Egmating (DE); Wolfram Wersing, Bergen (DE)

(73) Assignee: PYREOS LTD., Edinburgh (GB)

( * ) Notice: Subject to any disclaimer, the term of this patent is extended or adjusted under 35 U.S.C. 154(b) by 63 days.

(21) Appl. No.: 14/567,060

(22) Filed: Dec. 11, 2014

(65) Prior Publication Data

US 2015/0091007 A1    Apr. 2, 2015

Related U.S. Application Data

(63) Continuation of application No. PCT/EP2013/062154, filed on Jun. 12, 2013.

(30) Foreign Application Priority Data

Jun. 12, 2012 (DE) .................. 10 2012 105 036

(51) Int. Cl.
*H01L 21/4763* (2006.01)
*H01L 31/09* (2006.01)
(Continued)

(52) U.S. Cl.
CPC .......... *H01L 31/09* (2013.01); *C23C 14/0036* (2013.01); *C23C 14/025* (2013.01);
(Continued)

(58) Field of Classification Search
CPC ... H01L 27/20; H01L 41/0805; H01L 41/081; H01L 41/0815; H01L 41/083; H01L 41/18; H01L 41/1876; H01L 41/314
(Continued)

(56) References Cited

U.S. PATENT DOCUMENTS 6,440,210 B1    8/2002  Bruchhaus et al.
7,956,369 B2 *  6/2011  Reed et al. ............... 257/94
(Continued)

FOREIGN PATENT DOCUMENTS

DE    102011000752 B3    6/2012
JP        2008232896 A   10/2008
WO           0017921 A1    3/2000

OTHER PUBLICATIONS

Adachi, M. et al., "Sputter-Deposition of [111]-Axis Oriented . . . ", Japanese Journal of Applied Physics, vol. 26, No. 4, Apr. 1987, pp. 550-553, Dept of Electronics, Kyoto University, Kyoto 606.
(Continued)

*Primary Examiner* — Kyoung Lee
*Assistant Examiner* — Joannie A Garcia
(74) *Attorney, Agent, or Firm* — Ewers & Hasselmann PLLC

(57) ABSTRACT

A method for producing a micro system, said method comprising: providing a substrate (2) made of aluminum oxide; producing a thin film (6) on the substrate (2) by depositing lead zirconate titanate onto the substrate (2) with a thermal deposition method such that the lead zirconate titanate in the thin film (6) is self-polarized and is present predominantly in the rhombohedral phase; and cooling down the substrate (2) together with the thin film (6).

16 Claims, 1 Drawing Sheet

(51) Int. Cl.

| | | |
|---|---|---|
| C23C 14/00 | (2006.01) | |
| C23C 14/02 | (2006.01) | |
| C23C 14/08 | (2006.01) | |
| G01J 5/34 | (2006.01) | |
| H01L 37/04 | (2006.01) | |
| H01L 41/316 | (2013.01) | |
| H01L 31/032 | (2006.01) | |
| H01L 31/18 | (2006.01) | |

(52) U.S. Cl.
CPC ............. *C23C 14/088* (2013.01); *G01J 5/34* (2013.01); *H01L 31/032* (2013.01); *H01L 31/18* (2013.01); *H01L 37/04* (2013.01); *H01L 41/316* (2013.01)

(58) Field of Classification Search
USPC ...... 438/582, 648, 656, 685, 785, FOR. 352; 257/383, 763, 764, 770, E21.28, E21.253, 257/E21.129
See application file for complete search history.

(56) References Cited

U.S. PATENT DOCUMENTS

| | | | |
|---|---|---|---|
| 2003/0080329 A1* | 5/2003 | Kurasawa et al. | 257/3 |
| 2008/0218559 A1* | 9/2008 | Fujii et al. | 347/68 |
| 2013/0093290 A1* | 4/2013 | Fox et al. | 310/357 |
| 2014/0049136 A1 | 2/2014 | Giebeler et al. | |
| 2015/0091007 A1* | 4/2015 | Giebeler | C23C 14/0036 257/43 |

OTHER PUBLICATIONS

Schreiter, M. et al., "Sputtering of self-polarized PZT films . . . ", IEEE, Aug. 1998, pp. 181-185.
Lang, S.B. et al., "Specific heat of ferroelectric Pb . . . ", Journal of Applied Physics, vol. 111, No. 9, May 9, 2012.
Database WPI, Week 200868, Thomson Scientific, London, GB, XP002712129, Oct. 2, 2008.
International Search Report in counterpart International Application No. PCT/EP2013/062154, mailed Sep. 20, 2013.
Office Action in corresponding German Application No. 102012105036.8, dated Feb. 11, 2013, along with a partial English language translation.
Office Action in corresponding German Application No. 102012105036.8, dated Mar. 8, 2016, along with a partial English language translation.
Office Action in corresponding European Application No. 13728730.6-1362, dated Jan. 25, 2016, along with a partial English language translation.
Ibrahim, A. et al, "Morphotropic Phase Boundary in Ferroelectric Materials", in Michael Lallert: "Ferroelectrics-Physical Effects", Aug. 23, 2011, InTech, Rijeka [HR], XP055240702, pp. 1 to 26.

* cited by examiner

METHOD FOR PRODUCING A MICROSYSTEM HAVING A THIN FILM MADE OF LEAD ZIRCONATE TITANATE

CROSS-REFERENCE TO RELATED APPLICATIONS

This is a Continuation of International Application PCT/EP2013/062154, with an international filing date of Jun. 12, 2013, which was published under PCT Article 21(2) in German, and the entire disclosure of which is incorporated into the present application by reference. The present application also claims the benefit of German Patent Application No. 10 2012 105 036.8, filed on Jun. 12, 2012, which is also incorporated by reference into the present application in its entirety.

FIELD OF AND BACKGROUND OF THE INVENTION

The invention relates to a method for producing a micro system.

Thin films made of lead zirconate titanate (PZT) are widely used in micro system technology because of their advantageous physical properties, such as, for example, a high electromechanical coupling, a high dielectric constant or a high pyroelectric coefficient. A micro system typically has a substrate as a support for the thin film, where the substrate is usually made of silicon. The lead zirconate titanate is present in the thin film as a mixed crystal, which has a crystal symmetry that varies as a function of the zirconium content. Lead zirconate titanate with a low zirconium content is present primarily in the tetragonal phase, whereas lead zirconate titanate with a high zirconium content is present primarily in the rhombohedral phase. If the lead zirconate titanate has a morphotropic composition, for example, with a zirconium content of about 50%, then both tetragonal and rhombohedral microstructural constituents are simultaneously present in the thin film as grains. It is known to apply the thin film of lead zirconate titanate onto the substrate with a deposition method, in particular, a sputtering process, where the thin film is typically (111) textured. That is, the (111) directions of all of the grains of the thin film lie nearly parallel to the surface normal of the substrate surface.

In order to achieve the macroscopic piezoelectric and/or pyroelectric functionality of the thin film of lead zirconate titanate, it must have a preferential direction for the polarization. The optimal orientation of the preferred direction of the polarization depends on the respective desired physical effect that is to be achieved with the thin film, such as, for example, the pyroelectric effect. In order to optimize the pyroelectric effect, the preferential direction of the polarization of the thin film is oriented as parallel as possible to the surface normal of the substrate surface. Since in the rhombohedral phase the spontaneous polarization of a cell in the grid is in (111) direction, a (111) textured thin film provides the prerequisites for an optimal orientation of the polarization with respect to the pyroelectric effect.

The pyroelectric effect of the thin film is defined by the pyroelectric coefficient of the thin film. The value of the pyroelectric coefficient of the thin film depends more or less on the composition of the thin film made of lead zirconate titanate. If the thin film has a low zirconium content, then the thin film is present in a self-polarized form after its deposition and cooling down to room temperature. That is, during the deposition of the lead zirconate titanate the grown (111)-oriented thin film no longer changes its polarization state during the subsequent cooling. In contrast, the thin film that is rich in zirconium loses the self-polarization during cooling. This loss of self-polarization turns out to be disadvantageous in so far as for (111)-oriented, rhombohedral thin films of lead zirconate titanate a significantly higher pyroelectric effect is expected because of the optimum orientation of the polarization than for a thin film of a tetragonal composition. The production of self-polarized lead zirconate titanate is described by M. Schreiter, R. Bruchhaus, D. Pitzer and W. Wersing in "Sputtering of self-polarised PZT films for IR detector arrays", Proceedings of ISAF XI, 1998.

If, for example, an infrared light sensor is constructed on the basis of a thin film of lead zirconate titanate, then the value of the pyroelectric coefficient of the thin film enters linearly into the intensity of the sensor output signal, so that in the course of satisfying the objective of a strong pyroelectric effect, a high sensitivity of the sensor can be achieved. Hence, only lead zirconate titanate (PZT) thin films that have a low zirconium content should be considered as infrared light sensors with a high sensor sensitivity.

OBJECTS AND SUMMARY OF THE INVENTION

An object of the present invention is to provide a method for producing a micro system comprising a substrate and a thin film of lead zirconate titanate and having a high level of functionality. A further object is to provide an infrared light sensor chip with such a micro system.

These objects are achieved with the features recited in the independent claims set forth below. Preferred embodiments thereof are disclosed in the dependent claims.

The inventive method for producing the micro system, according to one formulation, comprises: providing a substrate made of aluminum oxide; producing a thin film on the substrate by depositing lead zirconate titanate onto the substrate via a thermal deposition method such that the lead zirconate titanate in the thin film is self-polarized and is present predominantly in the rhombohedral phase; and cooling down the substrate together with the thin film. The infrared light sensor chip of the present invention comprises the micro system.

It is preferred that the lead zirconate titanate have a pyroelectric coefficient of greater than $1.3*10^{-4}$ C/Km$^2$. Preferably the deposition method is a sputtering process or a laser ablation process. The deposition method is preferably a co-disposition process with three individual targets for the lead, zirconium and titanium respectively. The zirconium content of the lead zirconate titanate in the thin film is preferably in the range of the morphotropic phase boundary. It is even more preferred that the zirconium content of the lead zirconate titanate in the thin film be between 40% and 50%. The substrate temperature is preferably greater than 500° C. It is preferred that the lead zirconate titanate be deposited in an oxygen-containing atmosphere. Furthermore, the top side of the substrate preferably has a layer of platinum, onto which the lead zirconate titanate is deposited. Moreover, it is preferred that the substrate material be sapphire. The top side of the substrate is preferably polished; and, preferably, the thin film is deposited on this polished top side.

Tetragonal (111)-textured lead zirconate titanate and rhombohedral (111)-textured lead zirconate titanate have a different behavior with respect to the re-orientation of the polarization of domains. In the rhombohedral phase the (111) crystal direction is the direction of the spontaneous polarization, in which the orientation of domains at two different angles to the surface normal of the substrate is allowed. In the tetragonal phase, on the other hand, a (001) crystal direction forms the direction of the spontaneous polarization. Hence, for the thin film having the (111) oriented crystal direction, there is only one possible angle of the domain orientation to the surface normal of the substrate.

The method according to the invention achieves the objective that the lead zirconate titanate is present in the thin film of the micro system in rhombohedral form, wherein the lead zirconate titanate is self-polarized and has preferably a high pyroelectric coefficient of greater than $1.3*10^{-4}$ $C/Km^2$. As a result, the micro system has a high level of functionality. In the event that the thin film is used for pyroelectric applications, it is possible to achieve an advantageously strong pyroelectric effect due to the optimal orientation of the polarization. The layer of platinum, which is provided preferably between the substrate and the thin film, for example, for use as an electrode, has no negative influence on the effect that is to be achieved in accordance with the invention.

BRIEF DESCRIPTION OF THE DRAWINGS

The invention is explained below in the context of a preferred embodiment and with reference to the accompanying schematic drawings. The drawings show in.

DETAILED DESCRIPTION OF PREFERRED EMBODIMENTS

Figure 1:
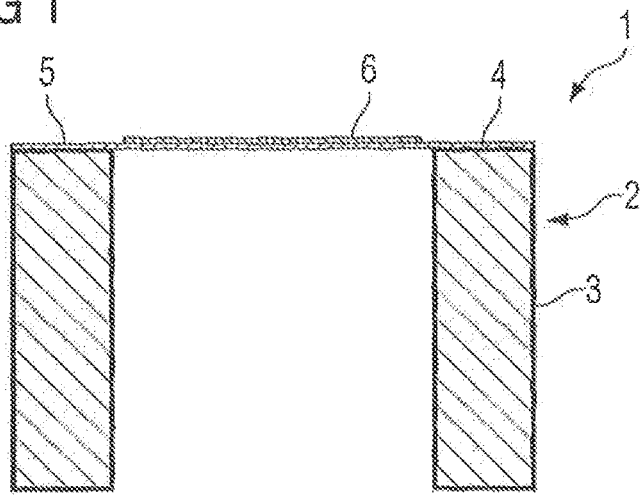
FIG. 1 a cross sectional view of an infrared light sensor chip.

As can be seen in FIG. 1, an infrared light sensor chip 1 is formed as a micro system. The infrared light sensor chip 1 has a substrate 2, which is formed by a frame 3 and a membrane 4. The frame 3 is arranged on the side facing away from the top side 5 of the membrane; and a thin film 6 is applied onto the top side 5 of said membrane. The top side 5 of the membrane is polished. The thin film material, from which the thin film 6 is made, is lead zirconate titanate. The lead zirconate titanate is present in the thin film 6 predominantly in the rhombohedral phase, where in this case the zirconium content in the thin film is at about 50%. The lead zirconate titanate is deposited via a thermal deposition method, in particular, a sputtering process, on the top side 5 of the membrane. Furthermore, the lead zirconate titanate is self-polarized and has a pyroelectric coefficient of greater than $1.3*10^{-4}$ $C/Km^2$. Between the thin film 6 and the substrate 2 there is an electrode layer that is made of platinum and that is used as an electrode of the infrared light sensor chip 1. The outside of the electrode layer of the substrate 2 is polished. The substrate material, which forms the substrate 2, is sapphire. In order to produce the substrate 2, a 3D laser scribing method can be used, for example, employing a picosecond laser. Another option is to provide the substrate material in an amorphous, polycrystalline or monocrystalline form.

The micro system is produced in a sputter deposition system that lends itself to carrying out the sputtering process. The substrate 2 is to be provided in the sputter deposition system at a temperature of more than 500° C. in an oxygen-containing atmosphere. The sputter deposition system has three individual targets for the lead, zirconium and titanium respectively, wherein the sputter deposition process generates a zirconium content of the lead zirconate titanate in the thin film that is in the range of the morphotropic phase boundary and is, in particular, preferably between 40% and 50%. Upon completion of the sputter deposition process, the micro system with the substrate 2 together with the thin film 6 is cooled down to ambient temperature.

After the cooling process, the lead zirconate titanate in the thin film 6 of the micro system is present in rhombohedral form, whereby the lead zirconate titanate is self-polarized and has a pyroelectric coefficient of greater than $1.3*10^{-4}$ $C/Km^2$. As a result, the thin film 6 has a strong pyroelectric effect; and, thus, the micro system has a high level of functionality. Such a feature is especially important when the lead zirconate titanate is used for the thin film 6 in an infrared light sensor chip 1. The provision of the electrode layer does not have an effect on the magnitude of the pyroelectric effect.

Figure 2:
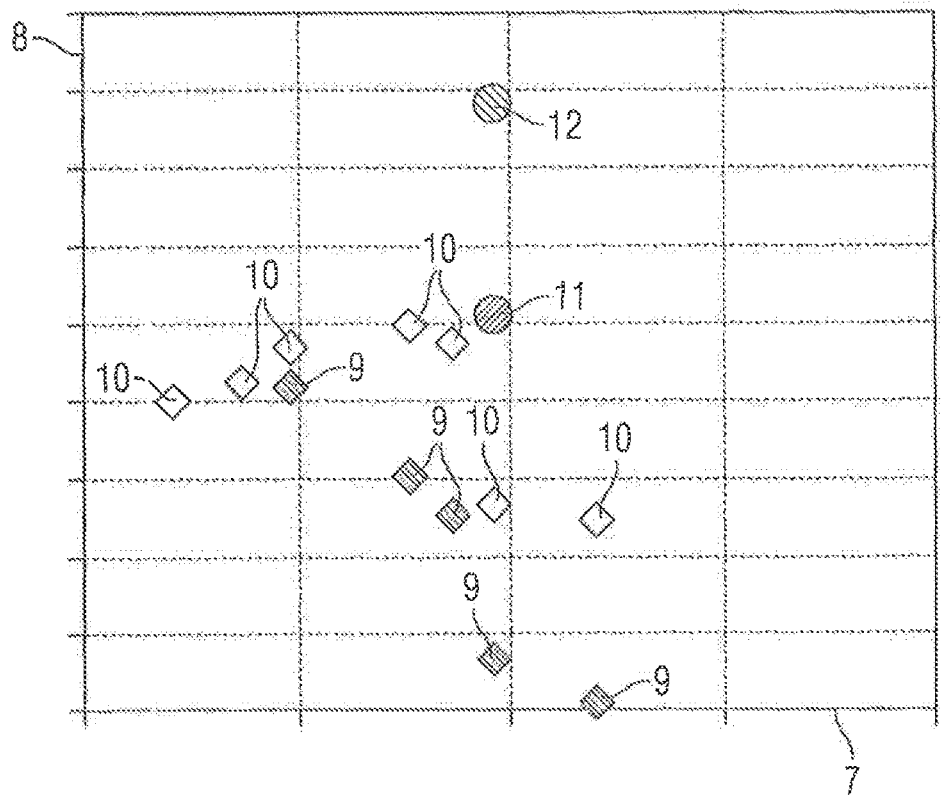
FIG. 2 a graph, on which the pyroelectric coefficients of thin films are shown as a function of their zirconium content.

FIG. 2 shows a graph depicting the magnitude of the pyroelectric effect of thin films of infrared light sensor chips, more specifically the pyroelectric effect of the infrared light sensor chips with a substrate made of silicon compared with the pyroelectric effect of the infrared light sensor chips with a substrate made of sapphire. The reference numeral 7 denotes the abscissa of the graph, on which the relative zirconium content in the lead zirconate titanate is plotted as Zr/(Zr+Ti). Furthermore, the reference numeral 8 denotes the ordinate of the graph, on which the pyroelectric coefficient $p_k$ of the lead zirconate titanate is plotted.

The reference numeral 9 denotes the entries assigned to the infrared light sensor chips having a silicon substrate with a thin film of lead zirconate titanate without additional polarization. The reference numeral 10 denotes the entries assigned to the infrared light sensor chips having a silicon substrate with a thin film of lead zirconate titanate with additional polarization. The reference numerals 11 and 12 denote the infrared light sensor chips comprising a sapphire substrate with a thin film of lead zirconate titanate respectively with (11) and without (12) additional polarization. The entries on the graph show that even in the self-polarized state of the infrared light sensor chips with the sapphire substrate, all of the conventionally achieved values of the pyroelectric coefficient of the infrared light sensor chips with the silicon substrate are exceeded by far. For the additionally polarized thin films, the net result is a significant increase in the pyroelectric coefficient of more than 1.5 times compared to the maximum value achieved in the conventional way with the silicon substrates.

Although the invention was described and shown in greater detail with reference to a preferred embodiment, this embodiment is presented only for illustrative purposes, and the invention is not restricted to the disclosed examples, from which the person skilled in the art can also derive other variations without departing from the scope of the invention.

LIST OF REFERENCE NUMERALS 1 infrared light sensor chip
2 substrate
3 frame
4 membrane
5 top side of the membrane
6 thin film
7 abscissa: Zr/(Zr+Ti)
8 ordinate $p_k$
9 silicon substrate with a thin film of lead zirconate titanate without additional polarization 10 silicon substrate with a thin film of lead zirconate titanate with additional polarization 11 sapphire substrate with a thin film of lead zirconate titanate without additional polarization 12 sapphire substrate with a thin film of lead zirconate titanate with additional polarization

The invention claimed is:

1. A method for producing a micro system, the method comprising:
providing a substrate made of aluminum oxide;
producing a thin film on the substrate by depositing lead zirconate titanate onto the substrate at a predefined temperature;
cooling down the substrate together with the thin film; and
increasing a value of a pyroelectric coefficient of the thin film by:
depositing the lead zirconate titanate onto the substrate with a thermal deposition method at a temperature of the substrate greater than 500° C. and maintaining a zirconium content of the lead zirconate titanate in the thin film between 40% and 50% such that the lead zirconate titanate in the thin film is self polarized and is present predominantly in a rhombohedral phase; and,
maintaining a rhombohedral form of the lead zirconate titanate as the substrate is cooled down together with the thin film.

2. The method as claimed in claim 1, wherein the lead zirconate titanate has a pyroelectric coefficient of greater than 1.3*10 4 C/Km2.

3. The method as claimed in claim 1, wherein the deposition method is a sputtering process or a laser ablation process.

4. The method as claimed in claim 1, wherein the deposition method comprises a co disposition process with three individual targets for the lead, the zirconium and the titanium respectively.

5. The method as claimed in claim 1, wherein a zirconium content of the lead zirconate titanate in the thin film is in a morphotropic phase boundary range.

6. The method as claimed in claim 1, wherein the lead zirconate titanate is deposited in an oxygen-containing atmosphere.

7. The method as claimed in claim 1, wherein the substrate has a top side comprising a layer of platinum, onto which the lead zirconate titanate is deposited.

8. The method as claimed in claim 1, wherein the substrate material is sapphire.

9. The method as claimed in claim 1, wherein the substrate has a top side that is polished, and the thin film is deposited on the polished top side.

10. An infrared light sensor chip with a micro system, comprising:
an aluminum oxide substrate; and
a lead zirconate titanate thin firm deposited on the substrate;
said lead zirconate titanate being self-polarized and being present predominantly in a rhombohedral phase; and,
said lead zirconate titanate having a zirconium content between 40% and 50% which increases a value of a pyroelectric coefficient of the thin film.

11. The infrared light sensor chip as claimed in claim 10, wherein the lead zirconate titanate has a pyroelectric coefficient of greater than 1.3*10 4 C/Km2.

12. The infrared light sensor chip as claimed in claim 10, wherein the substrate comprises a sapphire material.

13. A method for producing a micro system, the method comprising:
providing a substrate made of aluminum oxide;
producing a thin film on the substrate by:
depositing the lead zirconate titanate onto the substrate with a thermal deposition method;
maintaining a temperature of the substrate at a value greater than 500° C. as the lead zirconate titanate is deposited onto the substrate such that the lead zirconate titanate in the thin film is self polarized and is present predominantly in a rhombohedral phase; and,
cooling down the substrate together with the thin film.

14. The method as claimed in claim 13, wherein the lead zirconate titanate has a pyroelectric coefficient of greater than 1.3*10 4 C/Km2.

15. The method as claimed in claim 13, wherein a zirconium content of the lead zirconate titanate is between 40% and 50%.

16. The method as claimed in claim 13, wherein the substrate comprises a sapphire material.

* * * * *

UNITED STATES PATENT AND TRADEMARK OFFICE
CERTIFICATE OF CORRECTION

PATENT NO.      : 9,601,649 B2
APPLICATION NO. : 14/567060
DATED           : March 21, 2017
INVENTOR(S)     : Carsten Giebeler et al.

Page 1 of 1

It is certified that error appears in the above-identified patent and that said Letters Patent is hereby corrected as shown below:

In Column 5:
Line 31: delete "1.3*10 4 C/Km2" and substitute -- $1.3*10^{-4}$ $C/Km^2$ -- therefor.

In Column 6:
Line 21: delete "1.3*10 4 C/Km2" and substitute -- $1.3*10^{-4}$ $C/Km^2$ -- therefor.
Line 38: delete "1.3*10 4 C/Km2" and substitute -- $1.3*10^{-4}$ $C/Km^2$ -- therefor.

Signed and Sealed this
Thirtieth Day of May, 2017

Michelle K. Lee
*Director of the United States Patent and Trademark Office*